(12) United States Patent
Sills et al.

(10) Patent No.: US 10,741,755 B2
(45) Date of Patent: Aug. 11, 2020

(54) ARRAY OF CROSS POINT MEMORY CELLS

(71) Applicant: Micron Technology, Inc., Boise, ID (US)

(72) Inventors: Scott E. Sills, Boise, ID (US); Durai Vishak Nirmal Ramaswamy, Boise, ID (US); Alessandro Calderoni, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/041,374

(22) Filed: Jul. 20, 2018

(65) Prior Publication Data

US 2018/0331283 A1    Nov. 15, 2018

Related U.S. Application Data

(63) Continuation of application No. 14/808,959, filed on Jul. 24, 2015, now Pat. No. 10,134,982.

(51) Int. Cl.
| | |
|---|---|
| *H01L 27/24* | (2006.01) |
| *H01L 27/11* | (2006.01) |
| *H01L 45/00* | (2006.01) |
| *H01L 27/11507* | (2017.01) |

(52) U.S. Cl.
CPC .... *H01L 45/1233* (2013.01); *H01L 27/11507* (2013.01); *H01L 27/2409* (2013.01); *H01L 27/2436* (2013.01); *H01L 27/2472* (2013.01); *H01L 45/04* (2013.01); *H01L 45/06* (2013.01)

(58) Field of Classification Search
CPC ..... H01L 45/1233; H01L 27/11; H01L 27/24; H01L 45/04; H01L 45/06
USPC ......................................... 257/2–4
See application file for complete search history.

(56) References Cited

U.S. PATENT DOCUMENTS

| | | | |
|---|---|---|---|
| 4,070,653 | A | 1/1978 | Rao et al. |
| 5,828,092 | A | 10/1998 | Tempel |
| 6,144,060 | A | 11/2000 | Park et al. |
| 6,249,014 | B1 | 6/2001 | Bailey |
| 6,337,496 | B2 | 1/2002 | Jung |
| 6,611,014 | B1 | 8/2003 | Kanaya et al. |
| 6,635,528 | B2 | 10/2003 | Gilbert et al. |
| 6,876,021 | B2 | 4/2005 | Martin et al. |
| 6,940,085 | B2 | 9/2005 | Fricke et al. |
| 7,001,821 | B2 | 2/2006 | Aggarwal et al. |
| 7,304,339 | B2 | 12/2007 | Chen |

(Continued)

FOREIGN PATENT DOCUMENTS

| | | |
|---|---|---|
| CN | 102263122 | 11/2011 |
| CN | 104051231 | 9/2014 |

(Continued)

OTHER PUBLICATIONS

Junlabhut et al., "Optical Absorptivity Enhancement of SiO2 Thin Film by Ti and Ag Additive", Energy Procedia vol. 34, Dec. 2013, United Kingdom, pp. 734-739.

(Continued)

*Primary Examiner* — Sheikh Maruf
(74) *Attorney, Agent, or Firm* — Wells St. John P.S.

(57) ABSTRACT

An array of cross point memory cells comprises spaced first lines which cross spaced second lines. Two memory cells are individually between one of two immediately adjacent of the second lines and a same single one of the first lines.

11 Claims, 13 Drawing Sheets

(56) References Cited

U.S. PATENT DOCUMENTS

| | | | |
|---|---|---|---|
| 7,408,212 B1* | 8/2008 | Luan | G11C 13/0007 257/295 |
| 7,558,097 B2 | 7/2009 | Khellah et al. | |
| 8,193,522 B2 | 6/2012 | Li | |
| 8,212,256 B2 | 7/2012 | Chen et al. | |
| 8,217,443 B2 | 7/2012 | Izumi | |
| 8,969,170 B2 | 3/2015 | Liebau et al. | |
| 9,559,118 B2 | 1/2017 | Karda et al. | |
| 9,761,715 B2 | 9/2017 | Ramaswamy et al. | |
| 10,163,917 B2 | 12/2018 | Ramaswamy | |
| 10,396,145 B2 | 8/2019 | Balakrishnan et al. | |
| 2001/0040249 A1 | 11/2001 | Jung | |
| 2001/0044205 A1 | 11/2001 | Gilbert et al. | |
| 2002/0036313 A1 | 3/2002 | Yang et al. | |
| 2002/0102808 A1 | 8/2002 | Pu et al. | |
| 2002/0119621 A1 | 8/2002 | Lin | |
| 2003/0183867 A1 | 10/2003 | Fricke et al. | |
| 2004/0099893 A1 | 5/2004 | Martin et al. | |
| 2004/0114428 A1 | 6/2004 | Morikawa | |
| 2004/0129961 A1 | 7/2004 | Paz de Araujo et al. | |
| 2004/0228172 A1* | 11/2004 | Rinerson | G11C 11/5685 365/158 |
| 2005/0051822 A1 | 3/2005 | Manning | |
| 2005/0101034 A1 | 5/2005 | Aggarwal et al. | |
| 2005/0101086 A1* | 5/2005 | Rinerson | G11C 11/5685 438/257 |
| 2005/0167787 A1* | 8/2005 | Fricke | H01L 27/101 257/635 |
| 2006/0030110 A1 | 2/2006 | Kumura et al. | |
| 2006/0151771 A1 | 7/2006 | Asano et al. | |
| 2006/0181918 A1* | 8/2006 | Shin | G11C 11/22 365/149 |
| 2006/0284228 A1 | 12/2006 | Lee et al. | |
| 2007/0285970 A1 | 12/2007 | Toda et al. | |
| 2008/0266949 A1 | 10/2008 | He et al. | |
| 2008/0273363 A1* | 11/2008 | Mouli | G11C 13/0002 365/51 |
| 2009/0016094 A1* | 1/2009 | Rinerson | G11C 11/5685 365/148 |
| 2009/0026434 A1* | 1/2009 | Malhotra | H01L 45/08 257/2 |
| 2009/0029513 A1 | 1/2009 | Blanchard | |
| 2009/0078979 A1 | 3/2009 | Kumura et al. | |
| 2009/0153056 A1 | 6/2009 | Chen et al. | |
| 2010/0129938 A1 | 5/2010 | Kumura et al. | |
| 2010/0159641 A1* | 6/2010 | Rinerson | F01D 17/26 438/104 |
| 2010/0195393 A1* | 8/2010 | Eggleston | G06F 11/106 365/185.09 |
| 2010/0271885 A1* | 10/2010 | Scheuerlein | G11C 5/025 365/189.09 |
| 2010/0290294 A1* | 11/2010 | Siau | G11C 7/02 365/189.05 |
| 2011/0080767 A1* | 4/2011 | Rinerson | G11C 11/5685 365/148 |
| 2011/0147888 A1 | 6/2011 | Steigerwald et al. | |
| 2011/0188281 A1* | 8/2011 | Siau | G11C 5/02 365/51 |
| 2011/0188284 A1* | 8/2011 | Chevallier | G11C 5/02 365/51 |
| 2012/0012897 A1* | 1/2012 | Besser | H01L 27/101 257/208 |
| 2012/0051137 A1 | 3/2012 | Hung et al. | |
| 2013/0009125 A1* | 1/2013 | Park | H01L 27/101 257/4 |
| 2013/0043455 A1* | 2/2013 | Bateman | H01L 27/2454 257/5 |
| 2013/0214242 A1 | 8/2013 | Sandhu | |
| 2014/0034896 A1 | 2/2014 | Ramaswamy et al. | |
| 2014/0095853 A1 | 4/2014 | Sarangshar | |
| 2014/0138753 A1 | 5/2014 | Ramaswamy et al. | |
| 2014/0254276 A1 | 9/2014 | Tokuhira et al. | |
| 2014/0332750 A1 | 11/2014 | Ramaswamy et al. | |
| 2014/0346428 A1 | 11/2014 | Sills et al. | |
| 2015/0028280 A1* | 1/2015 | Sciarrillo | H01L 45/04 257/4 |
| 2015/0029775 A1 | 1/2015 | Ravasio et al. | |
| 2015/0054063 A1 | 2/2015 | Karda et al. | |
| 2015/0249113 A1* | 9/2015 | Takagi | H01L 45/1233 257/5 |
| 2015/0340610 A1* | 11/2015 | Jung | H01L 45/1293 257/4 |
| 2015/0349255 A1 | 12/2015 | Pellizzer et al. | |
| 2015/0357380 A1* | 12/2015 | Pellizzer | H01L 27/2463 257/5 |
| 2015/0380641 A1 | 12/2015 | Ino et al. | |
| 2016/0005961 A1 | 1/2016 | Ino | |
| 2016/0020389 A1* | 1/2016 | Ratnam | G11C 13/004 257/2 |
| 2016/0043143 A1* | 2/2016 | Sakotsubo | H01L 45/1253 257/4 |
| 2016/0240545 A1 | 9/2016 | Karda et al. | |
| 2017/0025604 A1* | 1/2017 | Sills | H01L 45/065 |
| 2017/0186812 A1* | 6/2017 | Lee | H01L 27/2427 |
| 2017/0243918 A1* | 8/2017 | Terai | H01L 27/2427 |
| 2018/0269216 A1* | 9/2018 | Lee | H01L 45/08 |
| 2019/0189357 A1 | 6/2019 | Chavan et al. | |

FOREIGN PATENT DOCUMENTS

| | | |
|---|---|---|
| CN | 201680050058.4 | 10/2019 |
| EP | 1624479 | 2/2006 |
| JP | H11-274429 | 10/1999 |
| JP | 2009-283763 | 12/2009 |
| KR | 10-0799129 | 1/2008 |
| KR | 10-2008-0092812 | 10/2008 |
| WO | WO 1999/014761 | 3/1999 |
| WO | WO 2008/126961 | 10/2008 |

OTHER PUBLICATIONS

Katiyar et al., "Electrical Properties of Amorphous Aluminum Oxide Thin Films", Acta Materialia vol. 55, Dec. 2005, Netherlands, pp. 2617-1622.

Li et al., "Low-Temperature Magnetron Sputter-Deposition, Hardness, and Electrical Resistivity of Amorphous and Crystalline Alumina Thin Films", Journal of Vacuum Science & Technology A vol. 18, No. 5, Sep.-Oct. 2000, United States, pp. 2333-2338.

Lv et al., "Transition Metal Dichalcogenides and Beyond: Synthesis, Properties, and Applications of Single- and Few-layer Nanosheets", American Chemical Society Accounts of Chemical Research vol. 48, Dec. 9, 2014, United States, pp. 56-64.

Podgornyi et al., "Leakage Currents in Thin Ferroelectric Films", Physics of the Solid State vol. 54, No. 5, Dec. 2012, Germany, pp. 911-914.

Schroeder et al., "Hafnium Oxide Based CMOS Compatible Ferroelectric Materials", ECS Journal of Solid State Science and Technology vol. 2(4), Jan. 28, 2013, United States, pp. N69-N72.

Caideroni et al., U.S. Appl. No. 16/255,569, filed Jan. 23, 2019, titled "Methods of Incorporating Leaker-Devices into Capacitor Configurations to Reduce Cell Disturb, and Capacitor Configurations Incorporating Leaker-Devices", 47 pages.

Mutch et al., U.S. Appl. No. 16/507,826, filed Jul. 10, 2019, titled "Memory Cells and Methods of Forming a Capacitor Including Current Leakage Paths Having Different Total Resistances", 43 pages.

Nigo et al., "Conduction Band Caused by Oxygen Vacancies in Aluminum Oxide for Resistance Random Access Memory", Journal of Applied Physics vol. 112, 2012, United States, 6 pages.

* cited by examiner

ARRAY OF CROSS POINT MEMORY CELLS

RELATED PATENT DATA

This patent resulted from a continuation application of U.S. patent application Ser. No. 14/808,959, filed Jul. 24, 2015, entitled "Array Of Cross Point Memory Cells", naming Scott E. Sills, Durai Vishak Nirmal Ramaswamy and Alessandro Calderoni as inventors, the disclosure of which is incorporated by reference.

TECHNICAL FIELD

Embodiments disclosed herein pertain to arrays of cross point memory cells.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. One type of capacitor is a ferroelectric capacitor which has ferroelectric material as at least part of the insulating material. Ferroelectric materials are characterized by having two stable polarized states and thereby can comprise programmable material of a memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. One type of memory cell has a select device electrically coupled in series with a ferroelectric capacitor.

Another type of non-volatile memory is phase change memory. Such memory uses a reversibly programmable material that has the property of switching between two different phases, for example between an amorphous disorderly phase and a crystalline or polycrystalline orderly phase. The two phases may be associated with resistivities of significantly different values. Presently, typical phase change materials are chalcogenides, although other materials may be developed. With chalcogenides, the resistivity may vary by two or more orders of magnitude when the material passes between the amorphous (more resistive) phase and the crystalline (more conductive) phase. Phase change can be obtained by locally increasing the temperature of the chalcogenide. Below 150° C., both phases are stable. Starting from an amorphous state and rising to temperature above about 400° C., a rapid nucleation of crystallites may occur and, if the material is kept at the crystallization temperature for a sufficiently long time, it undergoes a phase change to become crystalline. Reversion to the amorphous state can result by raising the temperature above the melting temperature (about 600° C.) followed by cooling.

Other reversibly programmable materials for memory cells exist and undoubtedly will be developed.

DETAILED DESCRIPTION OF EXAMPLE EMBODIMENTS

Embodiments of the invention encompass an array of cross point memory cells. FIGS. 1-9 show a small portion of a substrate construction 8 comprising an array 10 of individual cross point memory cells that has been fabricated relative to a base substrate 11. Substrate 11 may comprise any one or more of conductive (i.e., electrically herein), semiconductive, or insulative/insulator (i.e., electrically herein) materials. Various materials have been formed elevationally over base substrate 11. In this document, "elevational", "upper", "lower", "top", "bottom", and "beneath" are generally with reference to the vertical direction. "Horizontal" refers to a general direction along a primary surface relative to which the substrate is processed during fabrication, and vertical is a direction generally orthogonal thereto. Further, "vertical" and "horizontal" as used herein are generally perpendicular directions relative one another and independent of orientation of the substrate in three-dimensional space.

Figure 1:
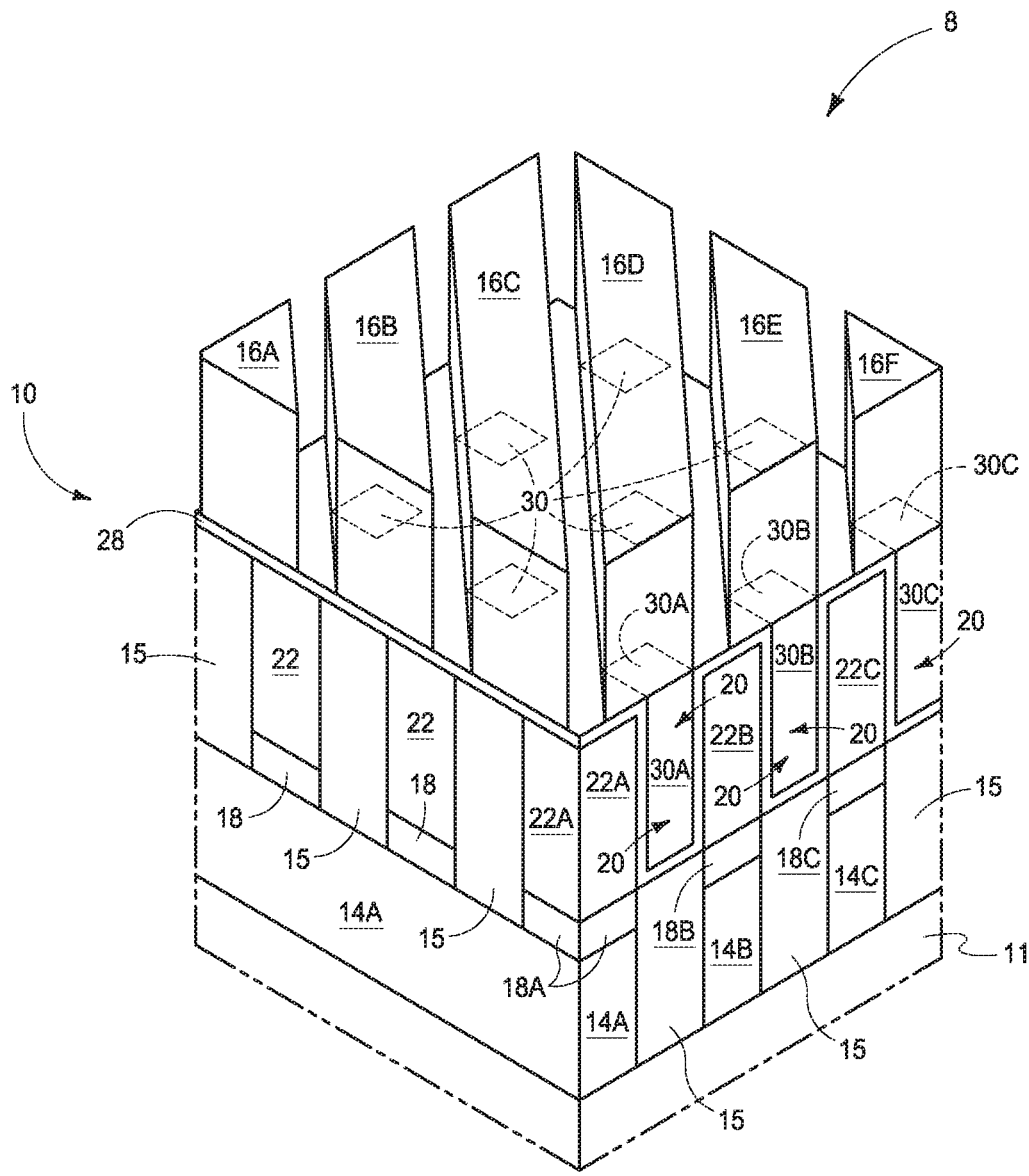
FIG. 1 is a diagrammatic isometric view of a substrate fragment comprising a portion of an array of cross point memory cells in accordance with an embodiment of the invention.
Figure 2:
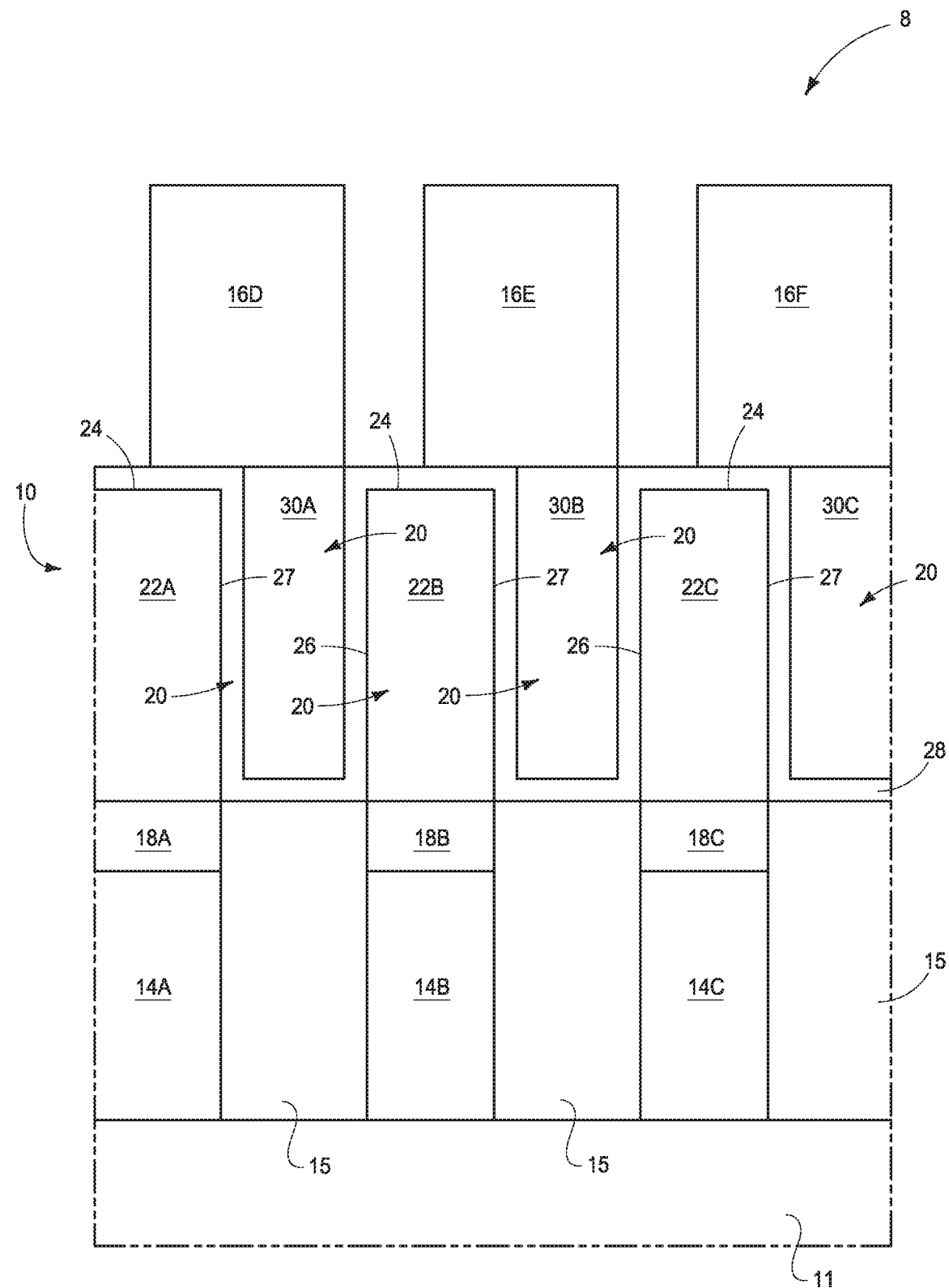
FIG. 2 is an enlarged side-elevational view of the FIG. 1 substrate.
Figure 3:
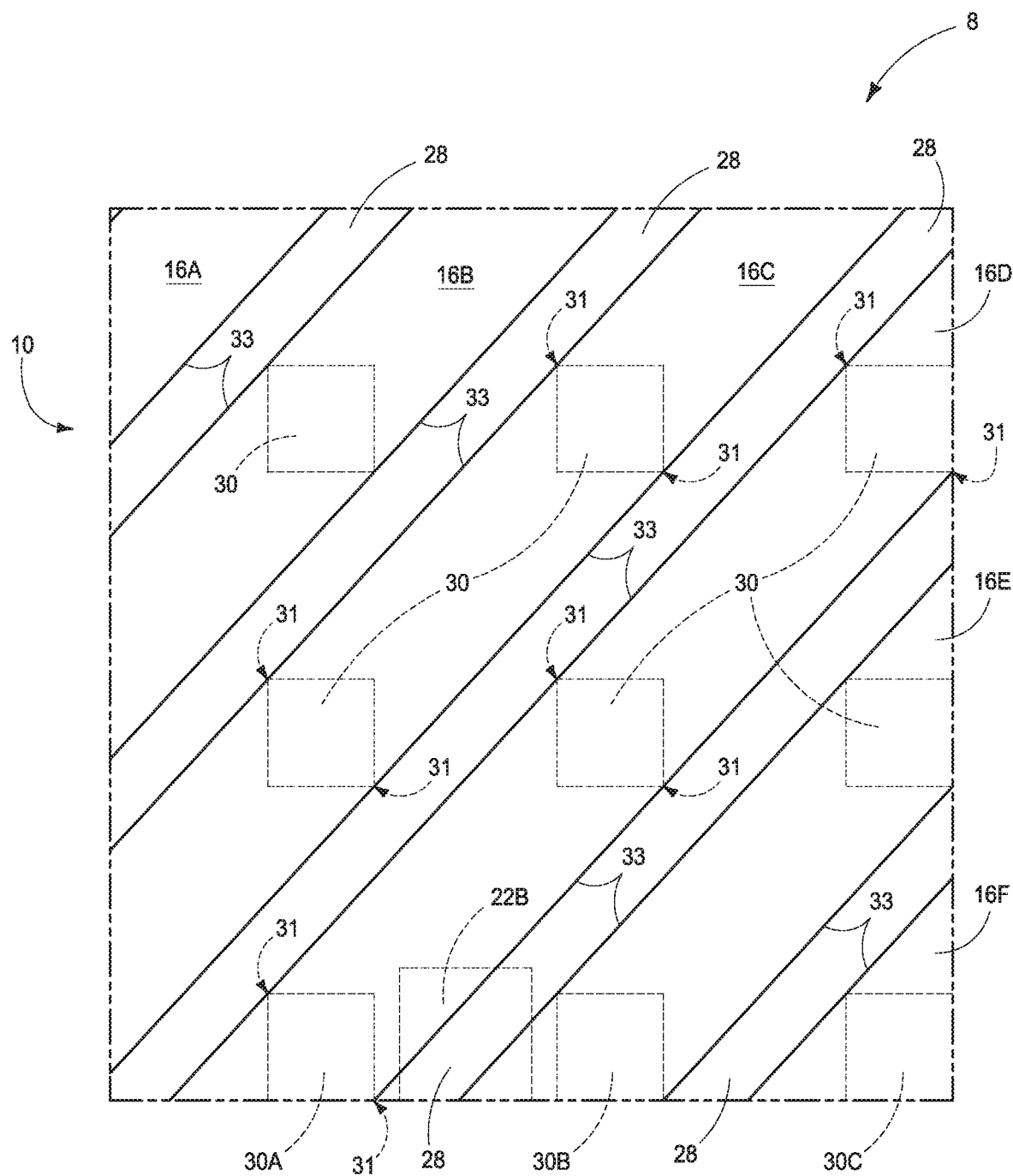
FIG. 3 is an enlarged diagrammatic top view the FIG. 1 substrate at the same scale as that of FIG. 2.

Materials may be aside, elevationally inward, or elevationally outward of the FIG. 1—depicted materials. For example, other partially or wholly fabricated components of integrated circuitry may be provided somewhere above, about, or within fragment 11. Control and/or other peripheral circuitry for operating components within the memory array may also be fabricated, and may or may not wholly or partially be within a memory array or sub-array. Further, multiple sub-arrays may also be fabricated and operated independently, in tandem, or otherwise relative one another. As used in this document, a "sub-array" may also be considered as an array. Regardless, any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

In one embodiment, array 10 comprises spaced lower first lines 14A, 14B, and 14C (also referred to as first lines 14 collectively and as individual first line[s] 14) and spaced upper second lines 16A, 16B, 16C, 16D, 16E, and 16F (also referred to as second lines 16 collectively and as individual second line[s] 16) which cross first lines 14. Reference to "first" and "second" with respect to different components herein is only for convenience in description in referring to different components. Accordingly. "first" and "second" may be interchanged independent of relative position within the finished circuit construction and independent of sequence in fabrication. Lines 14 and 16 comprise conductive material, with examples being elemental metals, a mixture or alloy of two or more elemental metals, conductive metal compounds, and conductively-doped semiconductive materials. Lines 14 and 16 may be of the same composition or of different compositions relative one another. In one embodiment, first lines 14 and second lines 16 angle other than orthogonally relative one another, and in one embodiment at an angle of about 45°. In one embodiment, the first and second lines are straight linear within the array. In one embodiment, lines 14 are access or word lines and lines 16 are sense or bit lines. Dielectric material 15 is between individual first lines 14. Analogously, dielectric material would be between immediately adjacent second lines 16 but is not shown for clarity.

Figure 4:
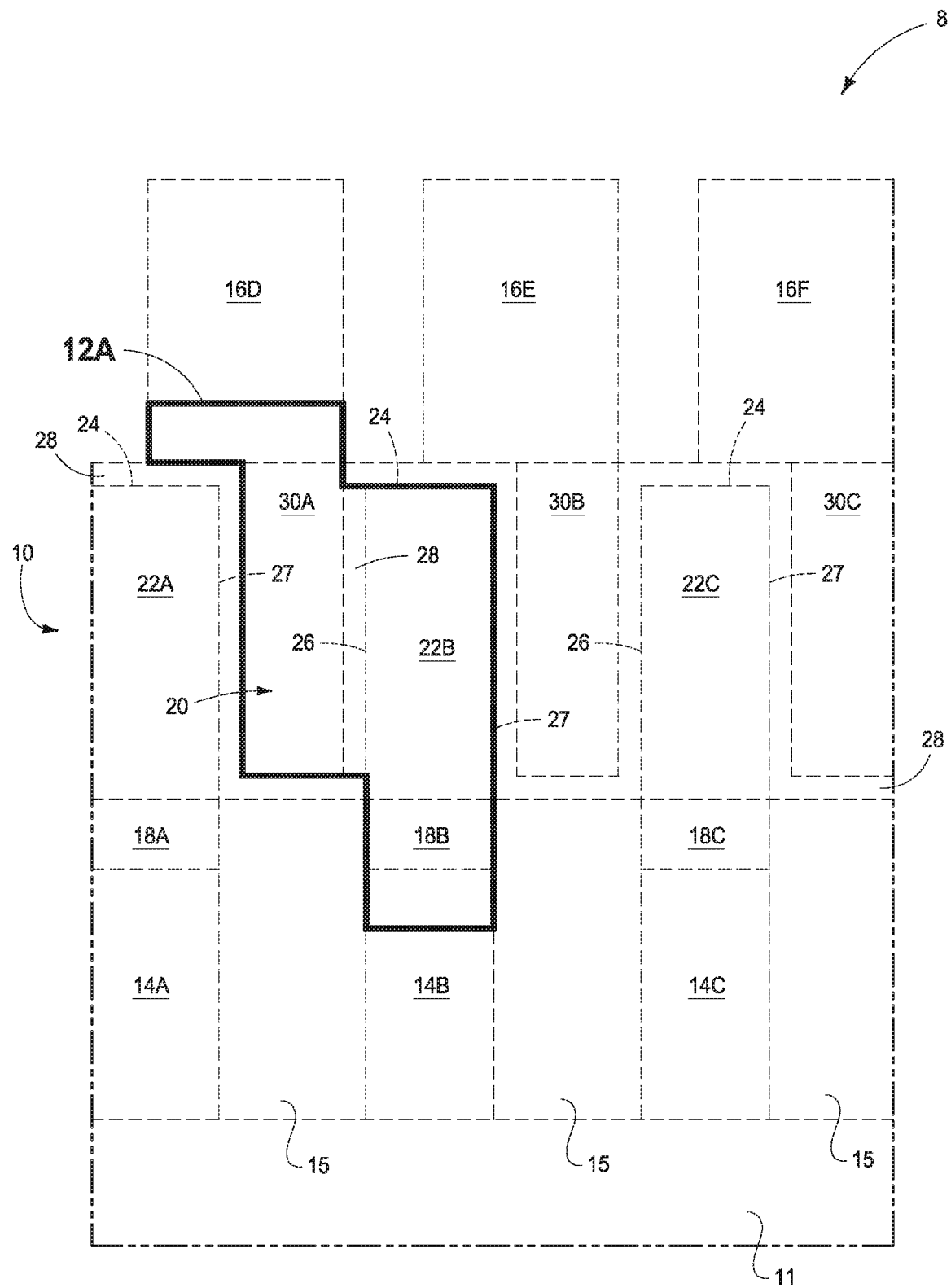
FIG. 4 is an enlarged side-elevational view like FIG. 2 and emphasizes an example outline of a single memory cell.
Figure 5:
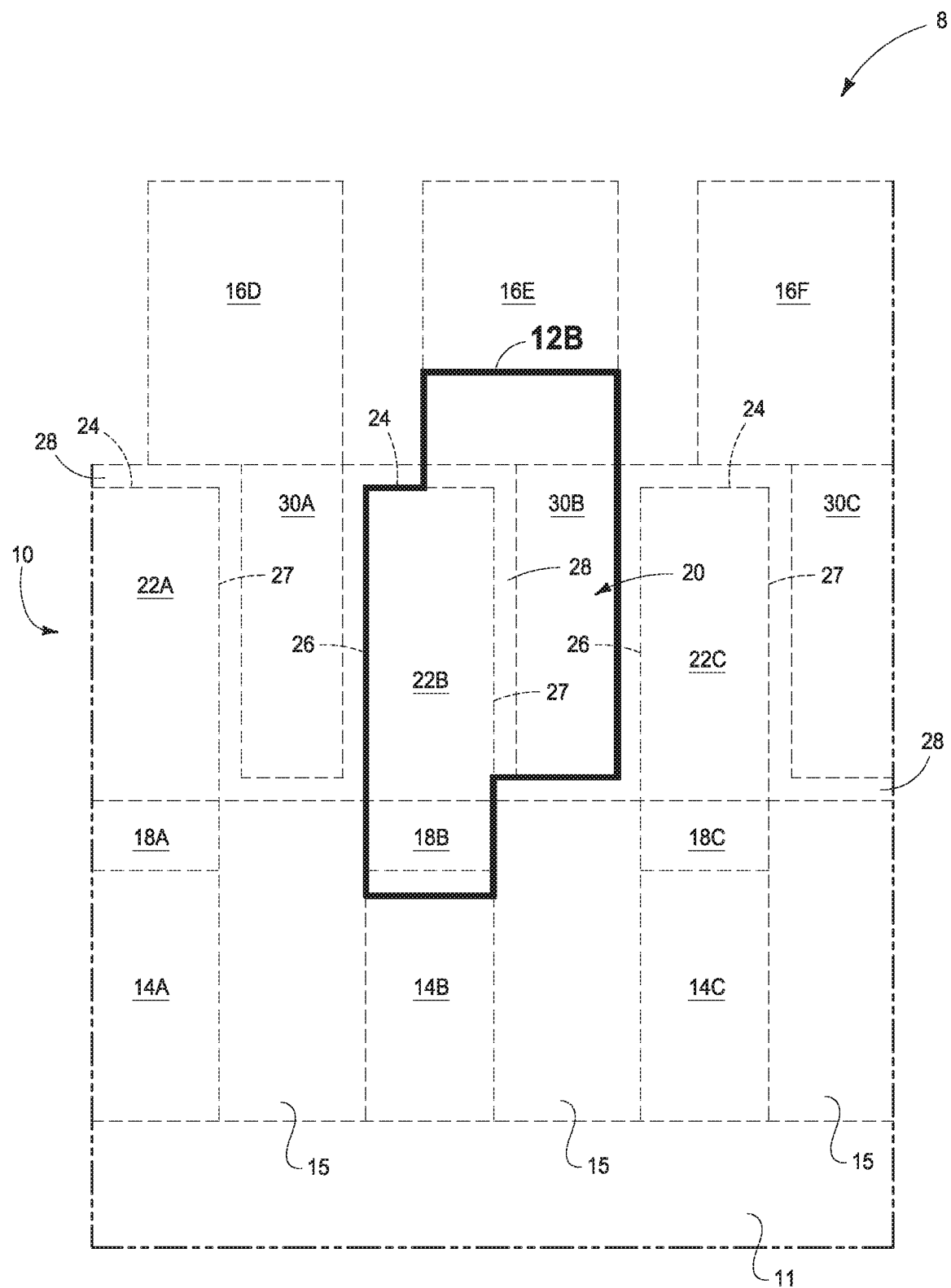
FIG. 5 is an enlarged side-elevational view like FIG. 2 and emphasizes an example outline of a single memory cell.
Figure 6:
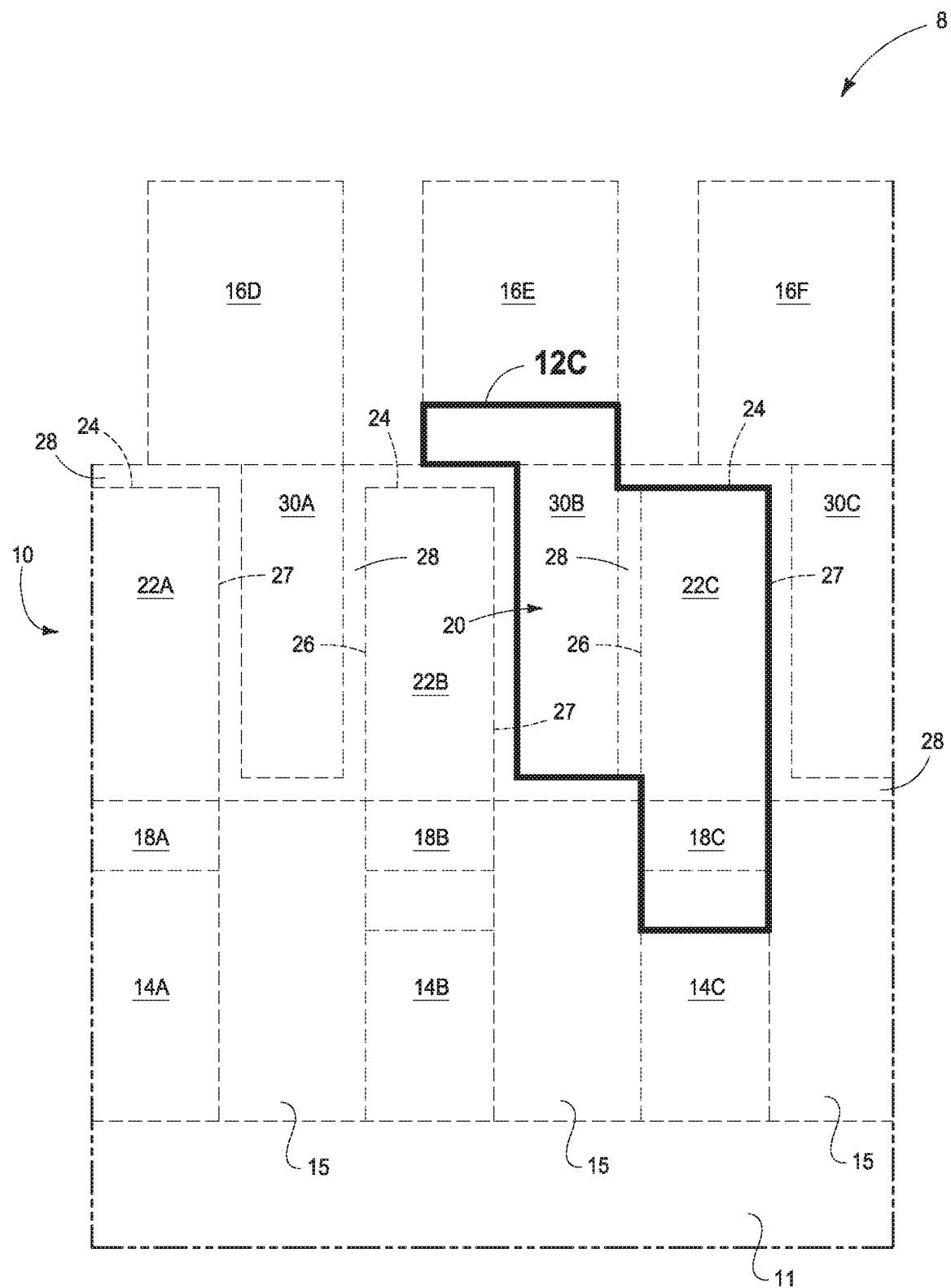
FIG. 6 is an enlarged side-elevational view like FIG. 2 and emphasizes an example outline of a single memory cell.
Figure 7:
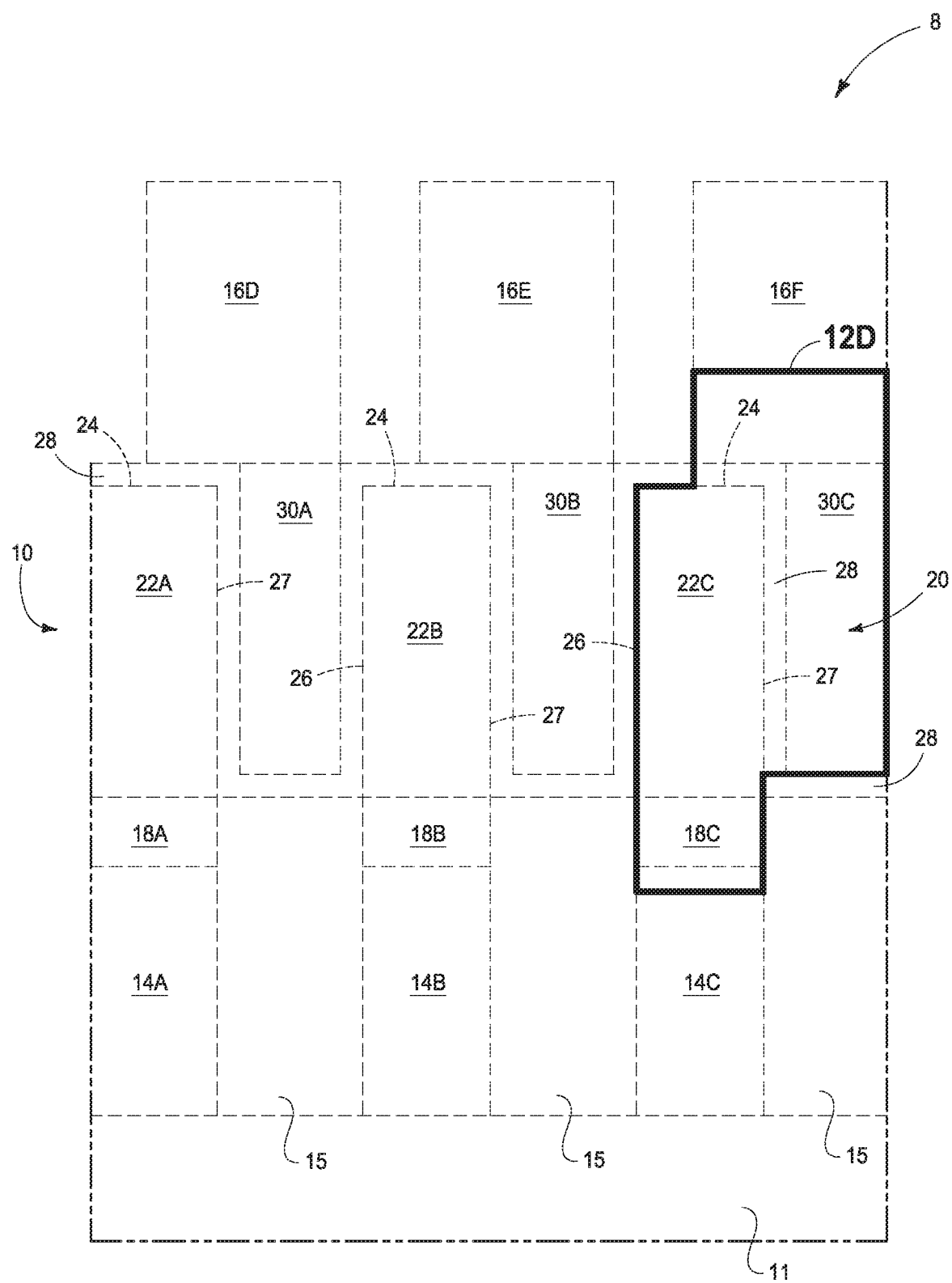
FIG. 7 is an enlarged side-elevational view like FIG. 2 and emphasizes an example outline of a single memory cell.
Figure 8:
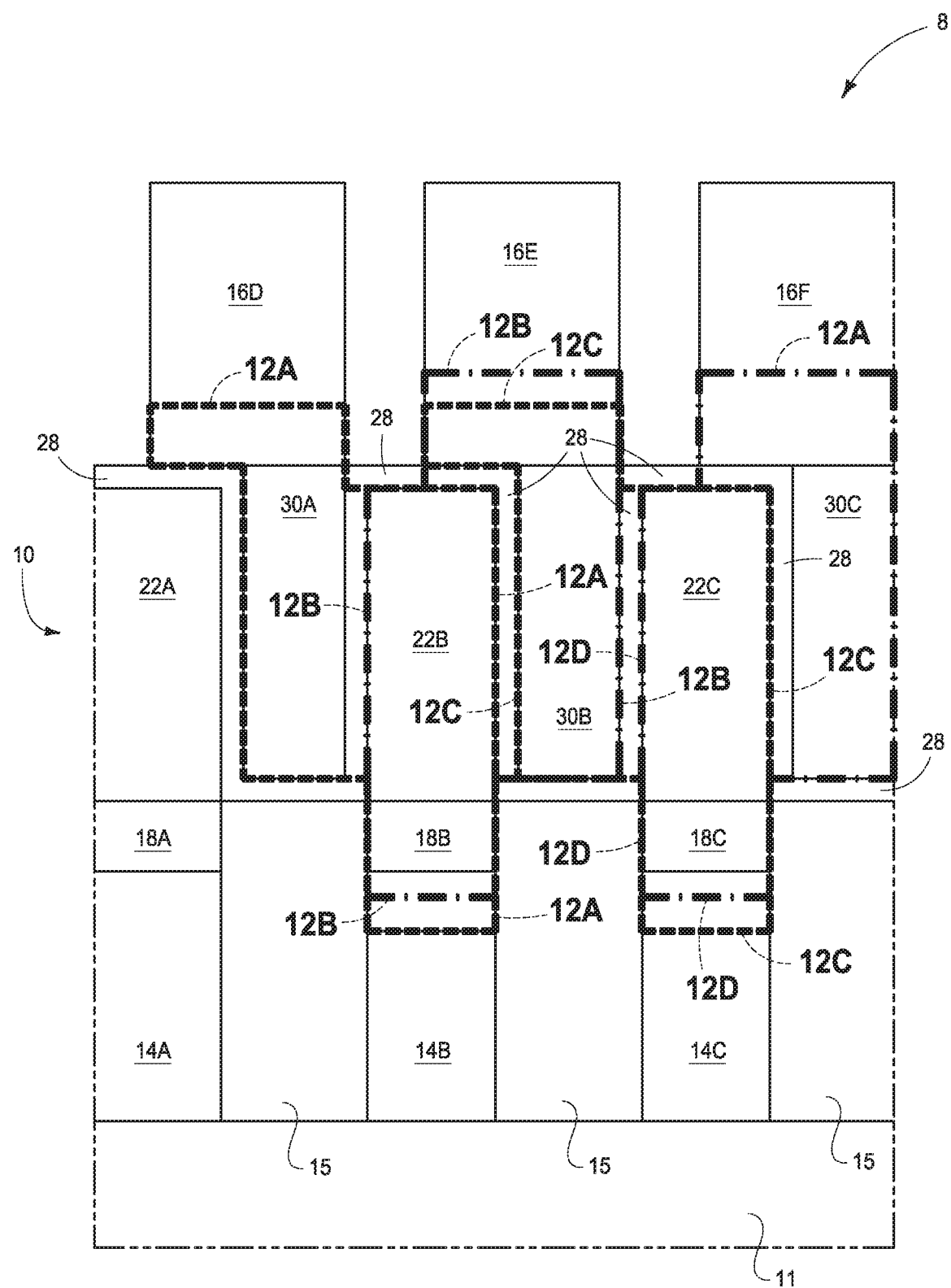
FIG. 8 is an enlarged side-elevation view like FIG. 2 and emphasizes example outlines of four memory cells in combination.

Two memory cells are individually elevationally between one of two immediately adjacent of the second lines and a same single one of the first lines. The two memory cells overlap and/or share some component(s), for example a same first line, and are accordingly difficult to show and perceive when example outlines of numerous memory cells of the array are shown and designated with numerals in a single figure. Accordingly, example outlines of individual memory cells are not shown or designated with numerals in FIGS. 1-3 and other figures are provided showing example individual memory cells to assist the reader. Specifically, FIGS. 4-8 collectively show four example memory cell outlines 12A, 12B, 12C, and 12D (also referred to as memory cells 12 collectively and as individual memory cell[s] 12). FIGS. 4-8 are the same essential FIG. 2—side elevational views of the FIG. 1 substrate yet designate only one or four memory cells 12A, 12B, 12C, and/or 12D. Specifically, FIG. 4 shows an example thick solid-line outline of only memory cell 12A. FIG. 5 shows an example thick solid-line outline of only memory cell 12B. FIG. 6 shows an example thick solid-line outline of only memory cell 12C. FIG. 7 shows an example thick solid-line outline of only memory cell 12D. FIG. 8 shows the outlines of memory cells 12A. 12B, 12C, and 12D taken together, and using two different style thick dashed-lines. Example outlines of immediately adjacent individual memory cells (e.g., 12A/12B, 12B/12C, 12C/12D) are shown as being elevationally staggered for ease of depiction in FIGS. 4-8.

Referring primarily to FIGS. 4, 5, and 8, the two memory cells 12A and 12B are individually elevationally between one of two immediately adjacent of the second lines (12A with 16D, and 12B with 16E) and a same single one 14B of first lines 14. Referring primarily to FIGS. 6-8, the two memory cells 12C and 12D are individually elevationally between one of two immediately adjacent of the second lines (12C with 16E, and 12D with 16F) and a same single one 14C of first lines 14.

Individual memory cells 12 comprise a select device 18 (the three on the front right face of construction 8 being labeled 18A, 18B, and 18C) and a programmable device 20 in series (i.e., electrical) with each other. Select device 18 is proximate (e.g., more so than is the programmable device) and electrically coupled to one of first lines 14 or one of second lines 16. Programmable device 20 is proximate (e.g., more so than is the select device) and electrically coupled to one of the other of a first line 14 or a second line 16. In one embodiment, select device 18 is directly electrically coupled to the one first or second line and in one embodiment programmable device 20 is directly electrically coupled to the one of the other first or second line. In this document, two electronic devices or components are "electrically coupled" to one another if in normal operation electric current is capable of continuously flowing from one to the other, and does so predominately by movement of subatomic positive and/or negative charges when such are sufficiently generated. Another electronic component may be between and electrically coupled to the two electrically coupled electronic components or devices. In contrast, when two electronic components or devices are referred to as being "directly electrically coupled", no intervening electronic component is between the two directly electrically coupled components or devices. In the example FIGS. 1-9 embodiments, select device 18 is proximate and directly electrically coupled to one of first lines 14 and programmable device 20 is proximate and directly electrically coupled to one of second lines 16. Any existing or yet-to-be developed select devices may be used, for example a junction device or a diode. Example diodes include PN diodes, PIN diodes, Schottky diodes, Zener diodes, avalanche diodes, tunnel diodes, diodes having more than three materials, etc. As an additional example, select device 18 may be a junction bipolar transistor. Select device 18 may include an elevationally outer and/or elevationally inner conductive material as a part thereof (not specifically shown).

Individual programmable devices 20 comprise a first electrode 22 (the front three being labeled 22A, 22B, and 22C) in the form of a conductive pillar elevationally over one of first lines 14. In this document, a "pillar electrode" and a "conductive pillar" is a conductive structure that is of radially continuous conductive material(s) longitudinally along at least a majority of its length. First pillar electrodes 22 individually comprise a top 24 and sidewalls 26 and 27 (FIGS. 2 and 4-7). Any suitable conductive material(s) may be used for first pillar electrodes 22, with TiN being one example. Individual first pillar electrodes 22 are shared by the two memory cells. For example as shown, first pillar electrode 22B is shared by memory cells 12A and 12B (FIGS. 4, 5, and 8), and first pillar electrode 22C is shared by memory cells 12C and 12D (FIGS. 6-8).

For an individual memory cell 12, programmable device 20 comprises programmable material 28 laterally outward of one of opposing sidewalls 26, 27 of an individual first pillar electrode 22. For example in memory cell 12A, programmable material 28 is at least laterally outward of sidewall 26 of first pillar electrode 22B (FIG. 4). For example in memory cell 12B, programmable material 28 is at least laterally outward of sidewall 27 of first pillar electrode 22B (FIG. 5). For example in memory cell 12C, programmable material 28 is at least laterally outward of sidewall 26 of first pillar electrode 22C (FIG. 6). For example in memory cell 12D, programmable material 28 is at least laterally outward of sidewall 27 of first pillar electrode 22C (FIG. 7). In one embodiment and as shown, programmable material 28 is elevationally over pillar top 24, and in one embodiment comprises a continuous layer extending over opposing sidewalls 26, 27 and top 24 of individual first pillar electrodes 22. Any existing or yet-to-be-developed programmable material may be used, for example those described in the "Background" section above.

Programmable device 20 includes a second electrode 30 (the three on the front right face of construction 8 being labeled 30A, 30B, and 30C) outward of the programmable material 28 that is laterally over the one opposing sidewall 26 or 27 of first pillar electrode 22. In one embodiment and as shown, individual second electrodes 30 are in the form of a conductive pillar. Second electrode 30 may be of the same or different composition from that of first pillar electrode 22, and may be of the same or different composition from second lines 16. In the depicted example, second electrode 30 is shown to be of different conductive composition than second lines 16. Regardless, second electrodes 30 may be considered as part of or an elevational extension of a conductive line 16. In one embodiment, programmable material 28 is beneath second electrode 30 between two immediately adjacent first lines 14. Further in one embodiment, programmable material 28 is continuous over multiple tops 24 and sidewalls 26, 27 of multiple first pillar electrodes 22, and beneath multiple second electrodes 30 between immediately adjacent first lines 14. In one embodiment, first pillar electrode 22 has a maximum conductive material width that is greater than that of second electrode 30 laterally proximate the programmable material that is laterally outward of the one opposing sidewall 26 or 27 of first pillar electrode 22. In one embodiment, first pillar electrode 22 has a maximum conductive material volume that is greater than that of second electrode 30. Regardless, in one embodiment programmable device 20 is a ferroelectric capacitor with programmable material 28 thereby comprising ferroelectric material.

The first pillar electrode or the second electrode is electrically coupled to the select device (in one embodiment directly electrically coupled) and the other of the first pillar electrode or the second electrode is electrically coupled (in one embodiment directly electrically coupled) to one of the first or second lines. In the depicted embodiment where select device 18 is proximate and electrically coupled to a first line 14, first pillar electrode 22 is elevationally over and electrically coupled to select device 18. Second electrode 30 is electrically coupled to one of second lines 16, and again may be considered as comprising a part thereof.

Figure 9:
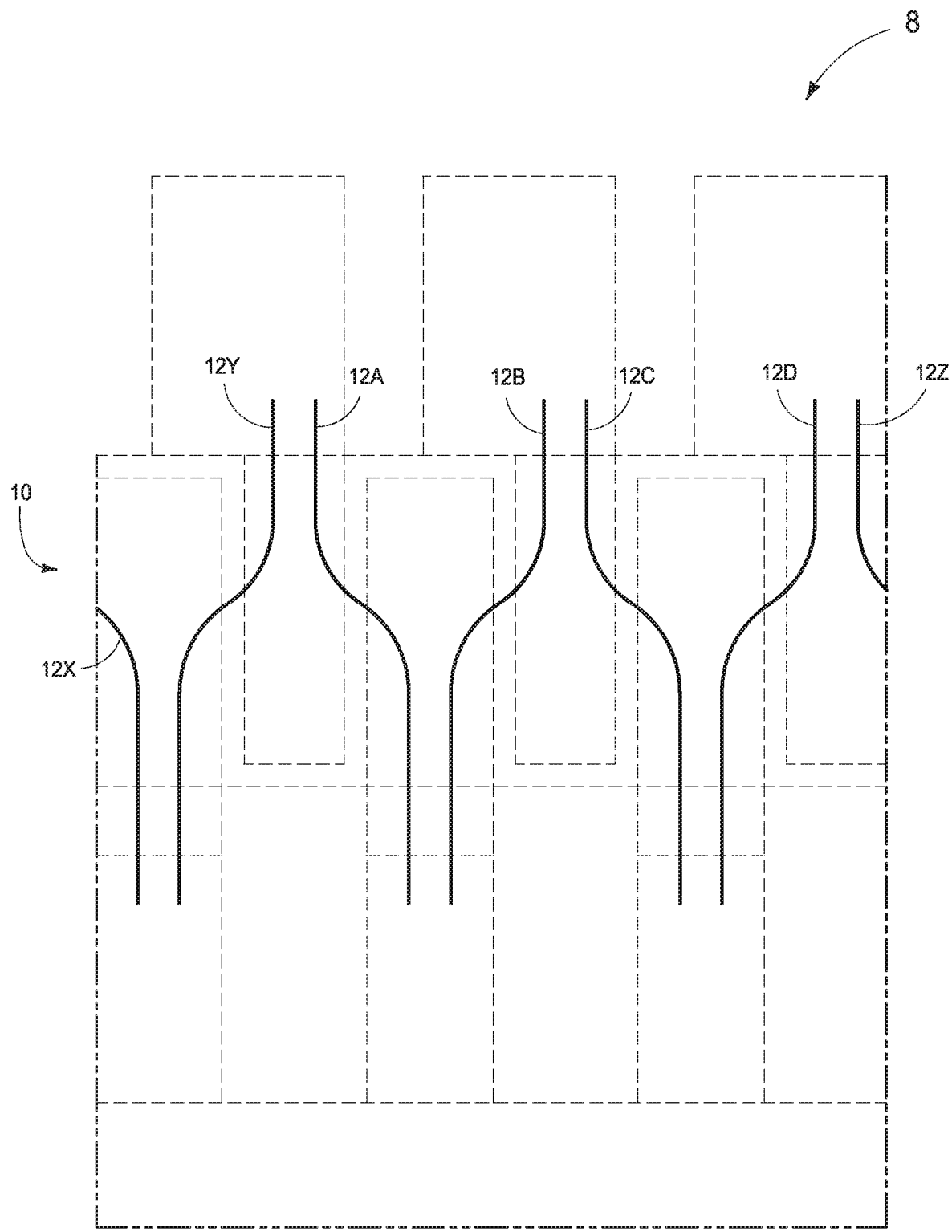
FIG. 9 is an enlarged side-elevational view like FIG. 2 and emphasizes current flow paths of seven memory cells.

FIG. 9 is provided to further assist the reader in perceiving the individual memory cells. FIG. 9 is essentially a repeat of FIG. 2 and wherein most of the numeral designations are removed for clarity. FIG. 9 shows in respective solid lines example current paths for memory cells 12A, 12B, 12C, and 12D. A solid-line current path 12X and a solid-line current path 12Y are shown for the two memory cells that would be to the immediate left of memory cell 12A. A solid-line current path 12Z is shown for the memory cell that would be to the immediate right of memory cell 12D.

Figure 13:
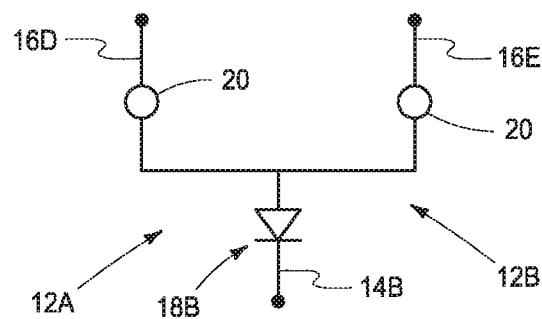
FIG. 13 is a diagrammatic schematic diagram of two memory cells in accordance with an embodiment of the invention.

FIG. 13 is a diagrammatic schematic showing two immediately adjacent memory cells of the FIGS. 1-9 construction, specifically showing memory cells 12A and 12B comprising second lines 16D and 16E, individual programmable devices 20, shared select device 18B, and single first line 14B.

Figure 10:
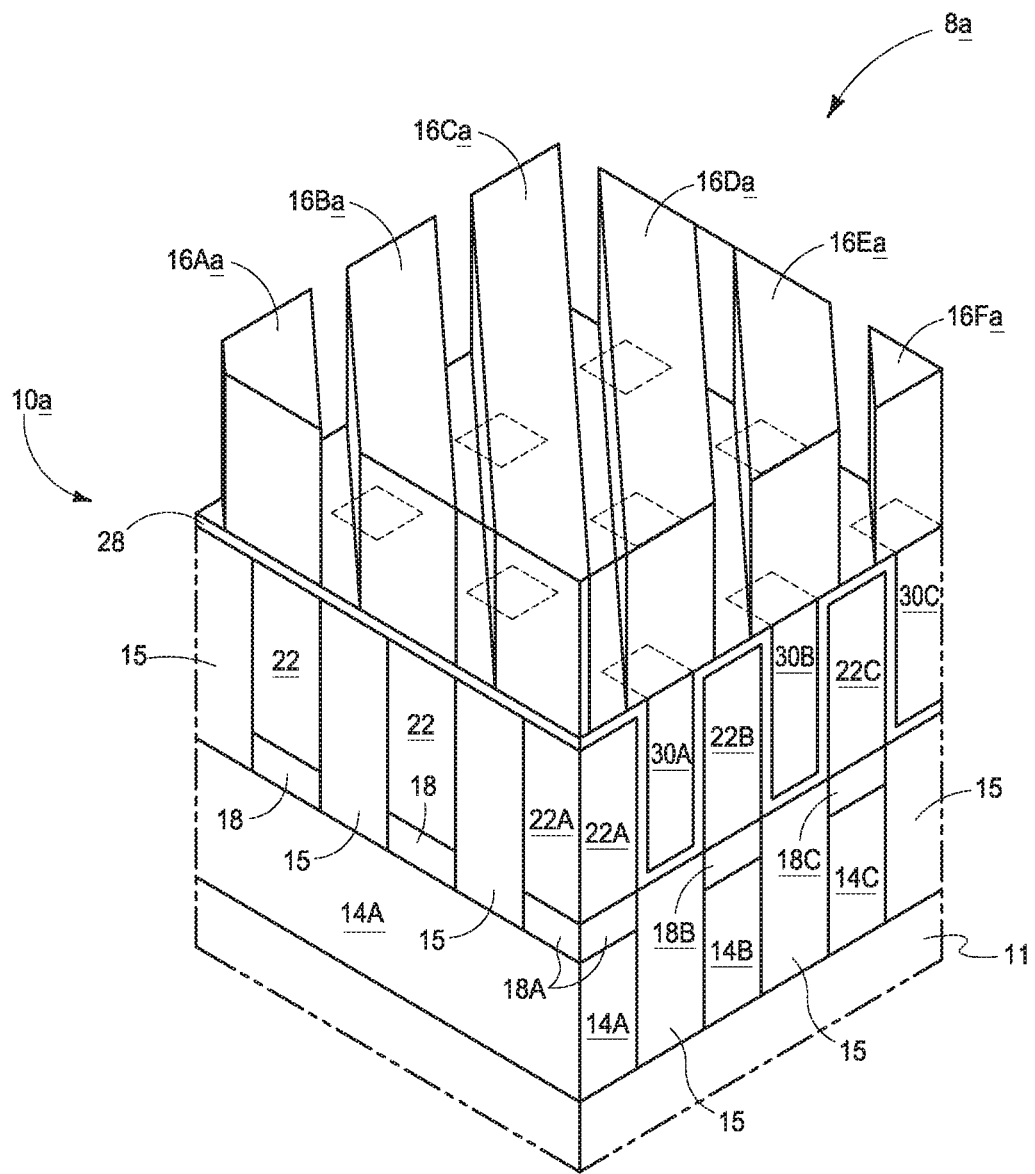
FIG. 10 is a diagrammatic isometric view of a substrate fragment comprising a portion of an array of cross point memory cells in accordance with an embodiment of the invention.
Figure 11:
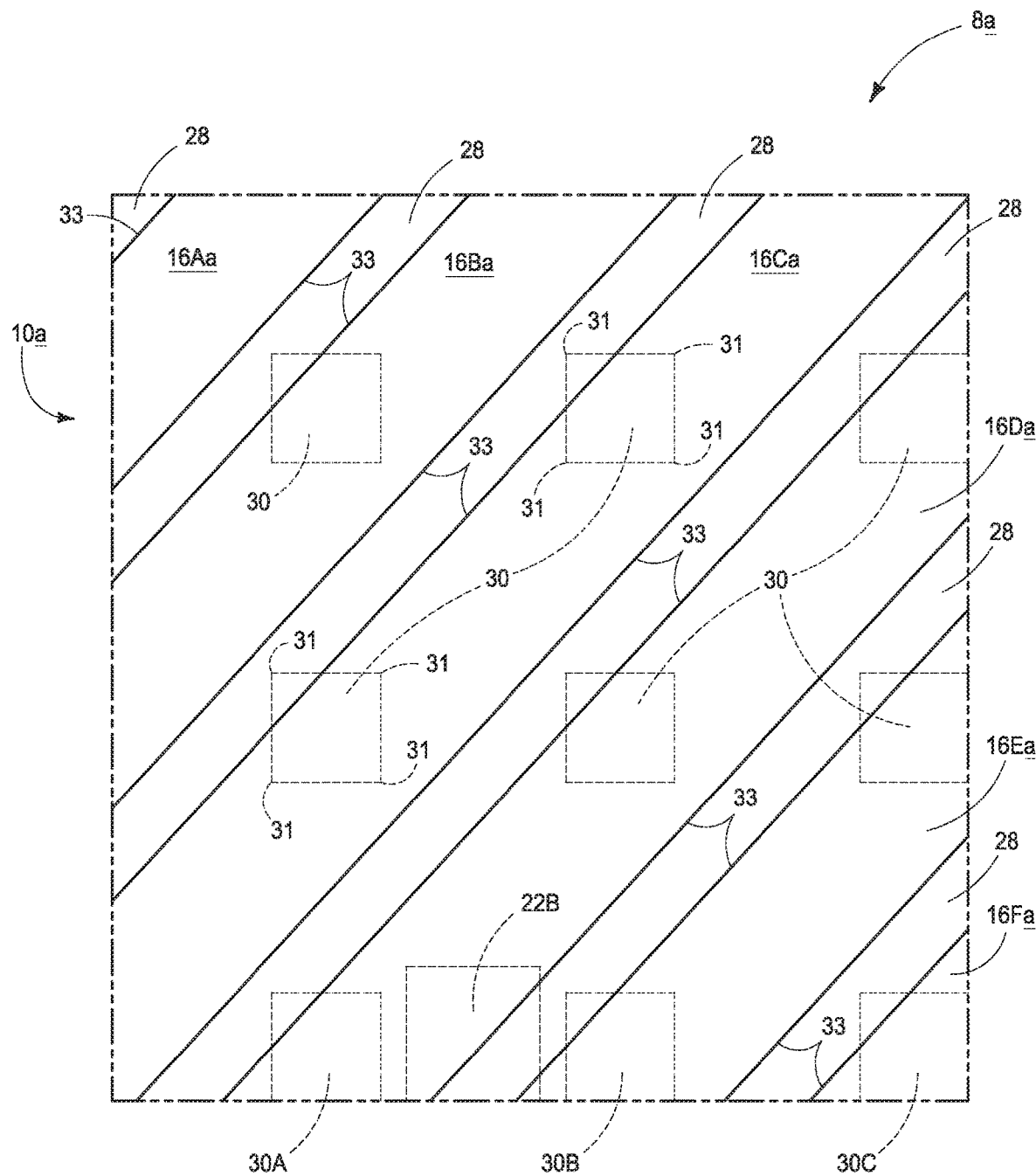
FIG. 11 is an enlarged top view of the FIG. 10 substrate.

In one embodiment, the second electrodes individually comprise a non-shared conductive pillar comprising a pair of laterally outermost corner edges and the second lines having laterally outermost longitudinal sidewalls. For example, as designated in FIG. 3, second electrodes 30 are non-shared with respect to any other second pillar electrode 30 for immediately adjacent memory cells and may be considered as having respective pairs of laterally outermost corner edges 31. Second lines 16 have laterally outermost sidewalls 33. In one embodiment and as shown, sidewalls 33 laterally align elevationally over the pairs of laterally outermost corner edges 31 of the non-shared conductive pillars along second lines 16. FIGS. 10 and 11 show an alternate example embodiment construction 8a to that shown in FIGS. 1-9 wherein no laterally outermost longitudinal sidewall of the second lines laterally aligns with any laterally outermost corner edge of the non-shared conductive pillars. Like numerals from the above-described embodiments have been used where appropriate, with some construction differences being indicated with the suffix "a". In array 10a, laterally outermost longitudinal sidewalls 33 do not align with any laterally outermost corner edge 31 of non-shared conductive pillars 30. Any other attribute(s) or aspect(s) as described above and/or shown generally in FIGS. 1-9 may be used in the FIGS. 10 and 11 embodiments.

Figure 12:
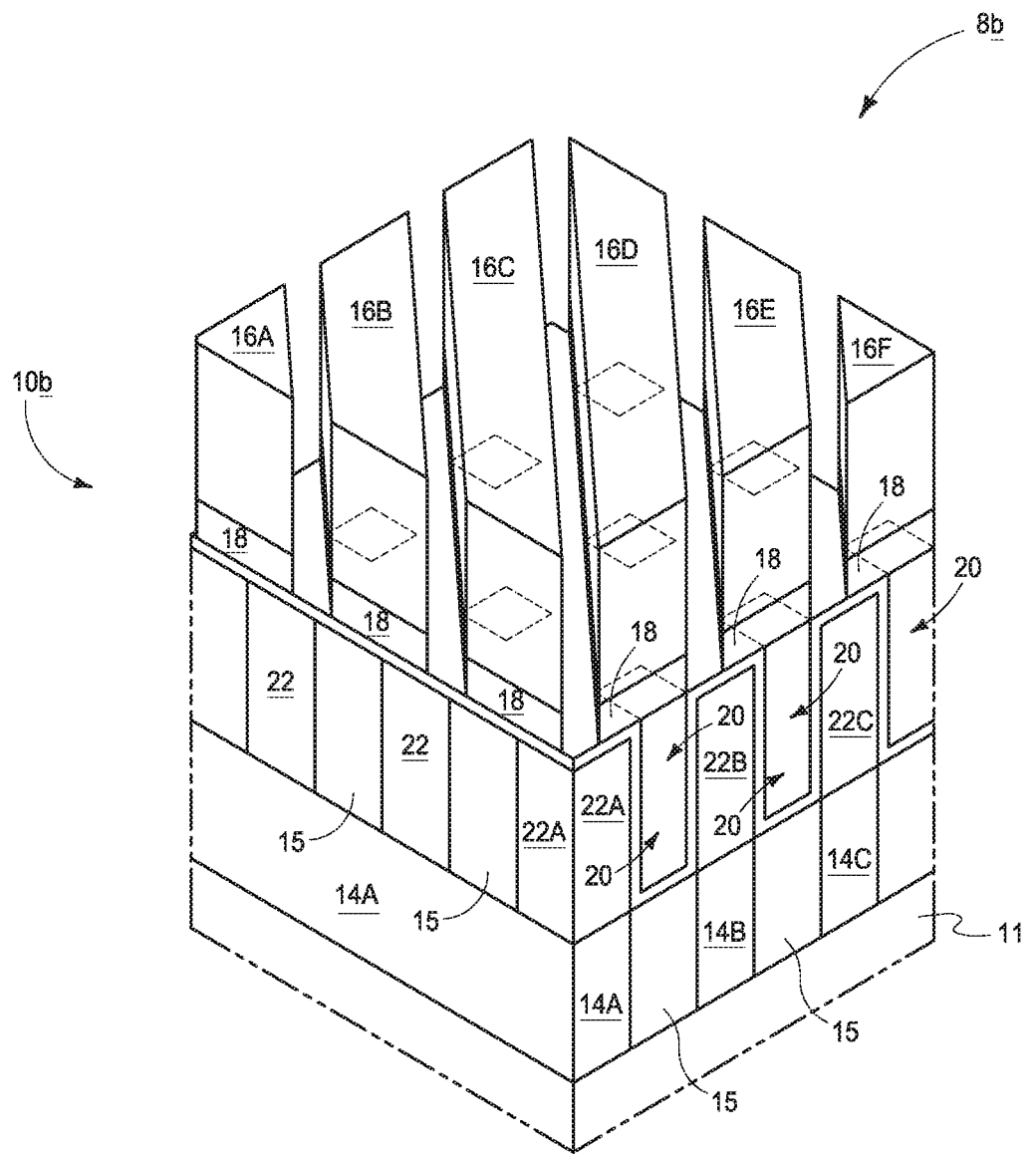
FIG. 12 is a diagrammatic isometric view of a substrate fragment comprising a portion of an array of cross point memory cells in accordance with an embodiment of the invention.

FIG. 12 shows an alternate embodiment construction 8b to that shown in FIG. 1. Like numerals from the above-described embodiments have been used where appropriate, with some construction differences being indicated with the suffix "b". In array 10b, individual memory cells have select device 18 proximate (e.g., more so than the programmable device) and electrically coupled to one of second lines 16. Programmable device 20 is proximate (e.g., more so than the select device) and electrically coupled to one of first lines 14. Accordingly, individual first pillar electrodes 22 are elevationally over, proximate, and electrically coupled to one first line 14 and individual second electrodes 30 are electrically coupled to one select device 18. Thereby, each memory cell has its own non-shared select device.

Figure 14:
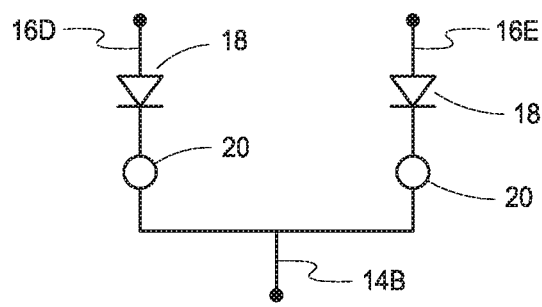
FIG. 14 is a diagrammatic schematic diagram of two memory cells in accordance with an embodiment of the invention.

FIG. 14 is a diagrammatic schematic showing two immediately adjacent memory cells of the FIG. 12 construction, specifically showing two immediately adjacent memory cells individually comprising a second line 16D or 16E, individual programmable devices 20, non-shared select devices 18, and single first line 14B.

Other attribute(s) or aspect(s) as described above and/or shown generally in FIGS. 1-11 may be used in the FIGS. 12 and 14 embodiments.

Embodiments of the invention encompass an array of cross point memory cells (e.g., 12) comprising spaced first lines (e.g., 14) which cross spaced second lines (e.g., 16, and independent of any elevational arrangement of the first lines relative to the second lines). Two memory cells are individually between one of the two immediately adjacent of the second lines and a same single one of the first lines (independent of presence of a select device, programmable material, and/or a shared pillar electrode). In one embodiment, the memory cells comprise select devices (e.g., 18), and in one embodiment comprise one select device for every memory cell (e.g., FIG. 14) and in another embodiment comprise one select device for every two memory cells (e.g., FIG. 13). In one embodiment, the two memory cells each comprise programmable material (e.g., 28) and a single shared select device electrically coupled to the one first line and electrically coupled to the programmable material of each of the two memory cells. In one embodiment, the two memory cells each comprise programmable material and two non-shared select devices individually electrically coupled to a respective one of the two immediately adjacent second lines and electrically coupled to the programmable material of a different one of the two memory cells.

In one embodiment, the first and second lines angle relative one another other than orthogonally, and in one such embodiment at about 45°. In one embodiment, the second lines are elevationally outward of the first lines. In one embodiment, the first and second lines are individually straight linear within the array. In one embodiment, the two memory cells are individually elevationally elongated and share an elevationally elongated conductive pillar, and in one embodiment which is elevationally over the one first line. In one embodiment, the two memory cells are individually elevationally elongated and collectively comprise a shared elevationally elongated conductive pillar (e.g., 22) and two non-shared elevationally elongated conductive pillars (e.g., 30). In one such embodiment, the two non-shared conductive pillars are individually of lower conductive material volume than that of the shared conductive pillar.

CONCLUSION

In some embodiments, an array of cross point memory cells comprises spaced first lines which cross spaced second lines. Two memory cells are individually between one of two immediately adjacent of the second lines and a same single one of the first lines.

In some embodiments, an array of cross point memory cells comprises spaced lower first lines, spaced upper second lines which cross the first lines, and two memory cells individually elevationally between one of two immediately adjacent of the second lines and a same single one of the first lines. The individual memory cells comprise a select device and a programmable device in series with each other. The select device is proximate and electrically coupled to one of the first or second lines. The programmable device is proximate and electrically coupled to one of the other of the first or second lines. The programmable device comprises a first pillar electrode elevationally over the one first line. The first pillar electrode comprises a top and opposing sidewalls. The first pillar electrode is shared by the two memory cells. Programmable material is laterally outward of one of the opposing sidewalls of the first pillar electrode. A second electrode is outward of the programmable material that is laterally outward of the one opposing sidewall of the first pillar electrode. One of the first pillar electrode or the second electrode is electrically coupled to the select device. The other of the first pillar electrode or the second electrode is electrically coupled to the one of the other of the first or second lines.

In some embodiments, an array of cross point memory cells comprises spaced lower first lines, spaced upper second lines which cross the first lines, and two memory cells individually elevationally between one of two immediately adjacent of the second lines and a same single one of the first lines. The individual memory cells comprise a select device and a programmable device in series with each other. The select device is proximate and directly electrically coupled to one of the first lines. The programmable device is proximate and directly electrically coupled to one of the second lines. The programmable device comprises a first pillar electrode elevationally over and directly electrically coupled to the select device. The first pillar electrode comprises a top and opposing sidewalls. The first pillar electrode and the select device are shared by the two memory cells. Programmable material is laterally outward of one of the opposing sidewalls of the first pillar electrode. A second pillar electrode is outward of the programmable material that is laterally outward of the one opposing sidewall of the first pillar electrode. The second pillar electrode is directly electrically coupled to the one second line.

In some embodiments, an array of cross point memory cells comprises spaced lower first lines, spaced upper second lines which cross the first lines, and two memory cells individually elevationally between one of two immediately adjacent of the second lines and a same single one of the first lines. The individual memory cells comprise a select device and a programmable device in series with each other. The select device is proximate and directly electrically coupled to one of the second lines. The programmable device is proximate and directly electrically coupled to one of the first lines. The programmable device comprises a first pillar electrode elevationally over and directly electrically coupled to the one first line. The first pillar electrode comprises a top and opposing sidewalls. The first pillar electrode is shared by the two memory cells. Programmable material is laterally outward of one of the opposing sidewalls of the first pillar electrode. A second pillar electrode is outward of the programmable material that is laterally outward of the one opposing sidewall of the first pillar electrode. The second pillar electrode is directly electrically coupled to the select device. Each of the two memory cells comprises its own non-shared select device.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array of cross point memory cells comprising spaced first lines which cross spaced second lines, two memory cells individually between one of two immediately adjacent of the second lines and a same single one of the first lines, each of the two memory cells individually comprising a single one and only one select device, a same single one select device for and that is shared by every two immediately adjacent of said memory cells, the two memory cells sharing a single first electrode and having non-shared second electrodes, the first electrode being a conductive pillar electrode.

2. The array of claim 1 wherein the two immediately adjacent memory cells each comprise programmable material, the same single shared select device being directly electrically coupled to the one first line and being directly electrically coupled to the programmable material of each of the two immediately adjacent memory cells.

3. An array of cross point memory cells comprising:
spaced first lines which cross spaced second lines; and
two memory cells individually between one of two immediately laterally adjacent of the second lines and a same single one of the first lines, the two memory cells being individually elevationally elongated and sharing an elevationally elongated conductive pillar electrode, the shared elevationally elongated conductive pillar electrode being electrically coupled to the same single one respective first line at a single one longitudinal location along the respective same single one first line on the same side of the respective same single one first line.

4. The array of claim 3 wherein the same side is a top side of the respective same single one first line.

5. The array of claim 3 wherein the shared elevationally elongated conductive pillar is directly electrically coupled to the respective same single one first line.

6. The array of claim 5 wherein the memory cells individually comprise a select device.

7. The array of claim 5 wherein the same side is a top side of the respective same single one first line.

8. The array of claim 3 wherein the memory cells individually comprise a select device, the shared elevationally elongated conductive pillar being electrically coupled to the respective same single one first line through the select device.

9. The array of claim 8 wherein the same side is a top side of the respective same single one first line.

10. The array of claim 8 wherein the shared elevationally elongated conductive pillar is directly electrically coupled to the select device and the select device is directly electrically coupled to the respective same single one first line.

11. The array of claim 10 wherein the same side is a top side of the respective same single one first line.

* * * * *